United States Patent
Kim et al.

(10) Patent No.: US 10,770,544 B2
(45) Date of Patent: Sep. 8, 2020

(54) SEMICONDUCTOR DEVICES

(71) Applicant: Samsung Electronics Co., Ltd., Suwon-si, Gyeonggi-do (KR)

(72) Inventors: Jee Yong Kim, Hwaseong-si (KR); Jung Hwan Lee, Seoul (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 16/725,076

(22) Filed: Dec. 23, 2019

(65) Prior Publication Data

US 2020/0144361 A1    May 7, 2020

Related U.S. Application Data

(63) Continuation of application No. 16/534,205, filed on Aug. 7, 2019, which is a continuation of application No. 15/988,053, filed on May 24, 2018, now Pat. No. 10,411,089.

(30) Foreign Application Priority Data

Dec. 4, 2017  (KR) ........................ 10-2017-0165077

(51) Int. Cl.
*H01L 29/06* (2006.01)
*H01L 27/1157* (2017.01)
(Continued)

(52) U.S. Cl.
CPC ...... *H01L 29/0649* (2013.01); *H01L 27/1157* (2013.01); *H01L 27/11573* (2013.01);
(Continued)

(58) Field of Classification Search
CPC .......... H01L 29/0649; H01L 29/42344; H01L 27/1157; H01L 29/6656; H01L 29/66545;
(Continued)

(56) References Cited

U.S. PATENT DOCUMENTS 8,373,222 B2  2/2013 Sekine et al.
9,040,378 B2  5/2015 Lee et al.
(Continued)

FOREIGN PATENT DOCUMENTS

KR        10-1093069 B1   12/2011
KR     10-2014-0069925 A    6/2014
KR     10-2016-0021376 A    2/2016

OTHER PUBLICATIONS

Notice of Allowance for corresponding U.S. Appl. No. 16/534,205 dated Jul. 17, 2020.

*Primary Examiner* — Victor A Mandala
(74) *Attorney, Agent, or Firm* — Harness, Dickey & Pierce, P.L.C.

(57) ABSTRACT

A semiconductor device includes a substrate including a recess, the recess being positioned below an isolation region and having a side portion including a plurality of stepped portions, a plurality of gate electrodes spaced apart from each other on the substrate, and stacked in a direction perpendicular to an upper surface of the substrate, a channel structure passing between a first set of the plurality of gate electrodes, and the isolation region passing between a second set of the plurality of gate electrodes, the isolation region extending from the upper surface of the substrate and having an inclined lateral surface.

30 Claims, 16 Drawing Sheets

(51) Int. Cl.
  *H01L 29/423* (2006.01)
  *H01L 27/11573* (2017.01)
  *H01L 29/66* (2006.01)
  *H01L 27/11582* (2017.01)
  *H01L 27/11578* (2017.01)

(52) U.S. Cl.
  CPC .. *H01L 27/11582* (2013.01); *H01L 29/42344* (2013.01); *H01L 29/6656* (2013.01); *H01L 29/66545* (2013.01); *H01L 27/11578* (2013.01)

(58) Field of Classification Search
  CPC ......... H01L 27/11582; H01L 27/11573; H01L 27/11578
  See application file for complete search history.

(56) References Cited

U.S. PATENT DOCUMENTS

| | | | |
|---|---|---|---|
| 9,230,974 B1 | 1/2016 | Pachamuthu et al. | |
| 9,455,269 B1 | 9/2016 | Noda | |
| 9,543,319 B1* | 1/2017 | Wu | H01L 27/11582 |
| 9,691,884 B2 | 6/2017 | Makala et al. | |
| 2011/0303971 A1 | 12/2011 | Lee et al. | |
| 2014/0151784 A1 | 6/2014 | Kwak | |
| 2015/0061155 A1 | 3/2015 | Seo et al. | |
| 2015/0137259 A1 | 5/2015 | Han et al. | |
| 2015/0166942 A1 | 6/2015 | Kang et al. | |
| 2015/0179577 A1 | 6/2015 | Tobitsuka et al. | |
| 2015/0228663 A1 | 8/2015 | Youn et al. | |
| 2016/0035423 A1 | 2/2016 | Nam et al. | |
| 2016/0049422 A1 | 2/2016 | Kim et al. | |
| 2016/0141419 A1 | 5/2016 | Baenninger et al. | |
| 2016/0343729 A1 | 11/2016 | Shin et al. | |
| 2017/0133389 A1 | 5/2017 | Yun et al. | |
| 2017/0373089 A1 | 12/2017 | Kim et al. | |
| 2018/0083029 A1* | 3/2018 | Tanaka | H01L 27/11582 |
| 2018/0122822 A1* | 5/2018 | Lee | H01L 27/1157 |
| 2018/0122907 A1 | 5/2018 | Choi et al. | |
| 2018/0175050 A1 | 6/2018 | Son et al. | |
| 2018/0261529 A1* | 9/2018 | Yoshimizu | H01L 21/76831 |
| 2018/0374869 A1 | 12/2018 | Kim et al. | |
| 2019/0067320 A1 | 2/2019 | Cho et al. | |
| 2019/0081054 A1* | 3/2019 | Kim | H01L 27/11575 |
| 2019/0103415 A1 | 4/2019 | Xiao et al. | |

\* cited by examiner

SEMICONDUCTOR DEVICES

CROSS-REFERENCE TO RELATED APPLICATION

This application is a Continuation of U.S. application Ser. No. 16/534,205, filed on Aug. 7, 2019, which is a Continuation of U.S. application Ser. No. 15/988,053, filed on May 24, 2018, which claims benefit of priority to Korean Patent Application No. 10-2017-0165077, filed on Dec. 4, 2017 in the Korean Intellectual Property Office, the entire contents of each of which are incorporated herein by reference in its entirety.

BACKGROUND

1. Field

Some example embodiments relate to semiconductor devices.

2. Description of Related Art

Electronic devices have gradually become smaller, while still processing large amounts of data. Accordingly, there is a desire to increase the degree of integration of semiconductor memory devices used in such electronic products. In order to improve the degree of integration of semiconductor memory devices, flat memory devices, including memory cells having a flat transistor structure, have continued to be scaled down. In recent years, vertical memory devices, in which memory cells, having a vertical transistor structure instead of a planar transistor structure, are stacked, have been proposed.

SUMMARY

Some example embodiments provide a semiconductor device in which the occurrence of bridge defects between gate electrodes and between the gate electrodes and a common source line may be reduced, and a slit (or a void) may be reduced or prevented from being formed within the common source line.

Some example embodiments provide a semiconductor device having improved reliability.

Some example embodiments provide a method of fabricating a semiconductor device, in which the occurrence of bridge defects between gate electrodes and between the gate electrodes and a common source line may be reduced and a slit (or a void) may be reduced or prevented from being formed within the common source line.

Some example embodiments provide a method of fabricating a semiconductor device having improved reliability.

According to some example embodiments, a semiconductor device includes a substrate including a recess, the recess being positioned below an isolation region and having a side portion including a plurality of stepped portions. The semiconductor device further includes a plurality of gate electrodes spaced apart from each other on the substrate, and stacked in a direction perpendicular to an upper surface of the substrate. The semiconductor device further includes a channel structure passing between a first set of the plurality of gate electrodes. The semiconductor device further includes the isolation region passing between a second set of the plurality of gate electrodes, the isolation region extending from the upper surface of the substrate and having an inclined lateral surface.

According to some example embodiments, a semiconductor device includes a substrate including a recess, the recess including a first region, a second region and a third region having different widths. The semiconductor device further includes a stack structure including a plurality of gate electrodes and a plurality of mold insulating layers alternately stacked on the substrate. The semiconductor device further includes a common source line passing through the stack structure to contact at least the first region of the recess, the common source line extending on the substrate in a direction.

According to some example embodiments, a semiconductor device includes a substrate including a recess, the recess including a first region having a first width, a second region having a second width greater than the first width, and a third region having a third width greater than the second width. The semiconductor device further includes a plurality of stack structures each including a plurality of gate electrodes and a plurality of insulating layers alternately stacked on the substrate; a plurality of channel structures passing through the plurality of stack structures to extend in a direction perpendicular to an upper surface of the substrate. The semiconductor device further includes a plurality of spacers between the stack structures, the plurality of spacers on the recess of the substrate and extending on the substrate in a direction, the spacers contacting at least lateral surfaces of the third region.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

Hereinafter, some example embodiments will be described with reference to the attached drawings.

Figure 1:
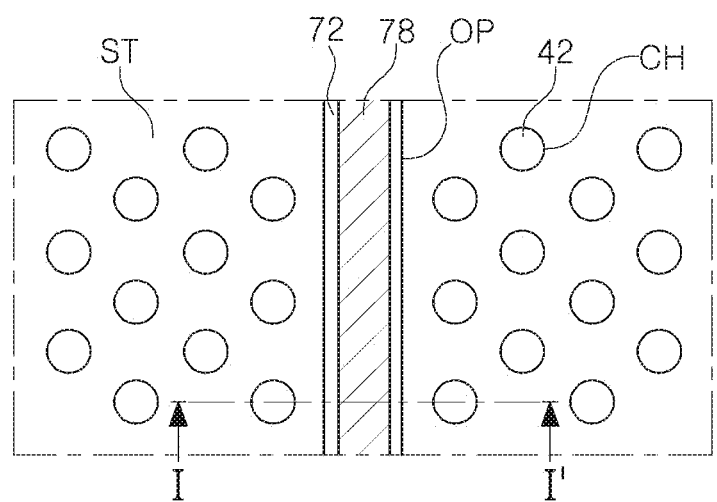
FIG. 1 is a plan view illustrating a portion of a cell region of a semiconductor device, according to some example embodiments.
Figure 2:
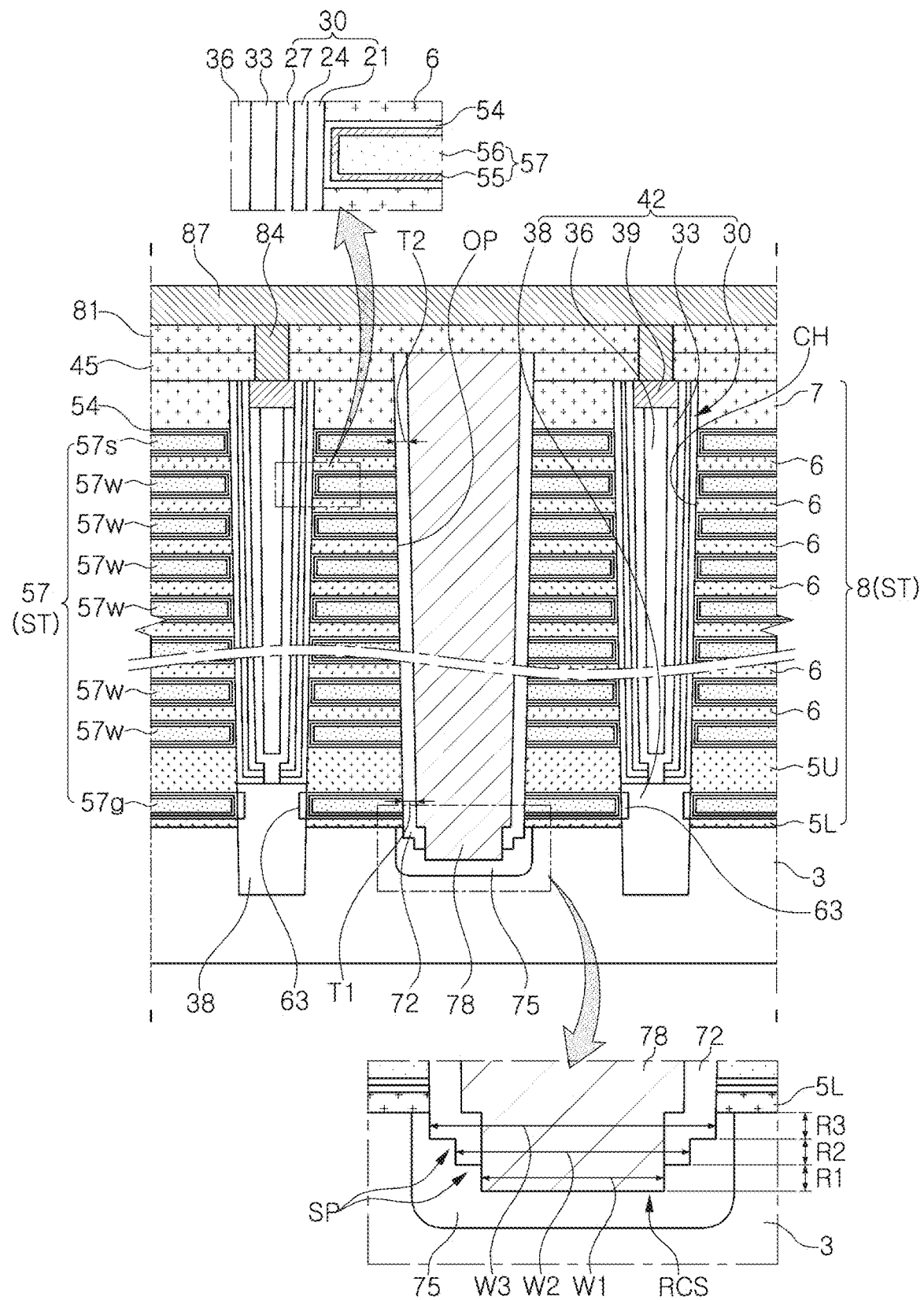
FIG. 2 is a cross-sectional view of a semiconductor device including a common source line having upper and lower regions, according to some example embodiments.

FIG. 1 is a plan view illustrating a portion of a cell region of a semiconductor device, according to some example embodiments; and FIG. 2 is a cross-sectional view taken along line I-I' of the semiconductor device FIG. 1 including a common source line having upper and lower regions.

Referring to FIGS. 1 and 2, the semiconductor device, according to some example embodiments, may include a substrate 3, a stack structure ST, a channel structure 42, a common source line 78, and an insulating spacer 72. The stack structure ST may include mold insulating layers 8 and conductive layers 57. The channel structure 42 may include a dielectric structure 30, a semiconductor layer 33, a filling insulating layer 36, a conductive pad 39, and a semiconductor pattern 38. The semiconductor device may further include a contact plug 84 connected to the conductive pad 39, and a bit line 87 connected to the contact plug 84.

The substrate 3 may include a semiconductor material, such as a group IV semiconductor material, a group III-V compound semiconductor material, or a group II-VI compound semiconductor material. For example, the substrate 3 may be a monocrystalline silicon substrate or a silicon-on-insulator (SOI) substrate.

The stack structure ST may be disposed on the substrate 3. The stack structure ST may include the mold insulating layers 8 and the conductive layers 57. The conductive layers 57 may be disposed between the mold insulating layers 8. The mold insulating layers 8 and the conductive layers 57 may be alternately and repeatedly stacked on the substrate 3. The conductive layers 57 may be spaced apart from each other on the substrate 3, and may be stacked in a second direction perpendicular to an upper surface of the substrate 3. The mold insulating layers 8 may be spaced apart from each other on the substrate 3, and may be stacked in the second direction perpendicular to the upper surface the substrate 3. Each of the conductive layers 57 may include a first conductive layer 55 and a second conductive layer 56.

In an example, the conductive layers 57 may include select gate electrodes 57s and 57g and cell gate electrodes 57w. The conductive layers 57 may be gate electrodes.

A lowermost select gate electrode 57g of the select gate electrodes 57s and 57g may be a ground select line (GSL), and an uppermost select gate electrode 57s thereof may be a string select line (SSL).

The cell gate electrodes 57w may be disposed between the uppermost select gate electrode 57s and the lowermost select gate electrode 57g. The cell gate electrodes 57w may be word lines of memory cells. The cell gate electrodes 57w may be spaced apart from each other in the second direction perpendicular to the upper surface of the substrate 3.

The mold insulating layers 8 may include a first lower mold insulating layer 5L disposed between the lowermost select gate electrode 57g and the substrate 3, a second lower mold insulating layer 5U disposed between the lowermost select gate electrode 57g and a lowermost cell gate electrode of the cell gate electrodes 57w, intermediate mold insulating layers 6 disposed between the cell gate electrodes 57w and between an uppermost cell gate electrode of the cell gate electrodes 57w and the uppermost select gate electrode 57s, and an upper mold insulating layer 7 disposed on the uppermost select gate electrode 57s. The first lower mold insulating layer 5L, contacting an upper surface of the substrate 3, may be thinner than each of the intermediate mold insulating layers 6. The second lower mold insulating layer 5U and the upper mold insulating layer 7 may be thicker than each intermediate mold insulating layer 6.

The channel structure 42 may be disposed within a channel hole CH passing through the stack structure ST. For example, the channel structure 42 may pass through the stack structure ST. The channel hole CH may have a width narrowing toward a lower region thereof.

The channel structure 42 may include the semiconductor layer 33 extending in the second direction perpendicular to the upper surface of the substrate 3, and the dielectric structure 30 disposed between the semiconductor layer 33 and the stack structure ST. The semiconductor layer 33 may be a channel layer.

The dielectric structure 30 may include a first dielectric layer 21, a second dielectric layer 24, and a third dielectric layer 27 sequentially formed within the channel hole CH. The second dielectric layer 24 may be interposed between the first and third dielectric layers 21 and 27. The second dielectric layer 24 may contact the first and third dielectric layers 21 and 27. The third dielectric layer 27 may contact the semiconductor layer 33. The first dielectric layer 21 may be a blocking layer. The first dielectric layer 21 may include, for example, a silicon oxide. The second dielectric layer 24 may be a charge storage layer. The second dielectric layer 24 may be a charge trapping layer. The second dielectric layer 24 may include a silicon nitride, a silicon oxynitride, and a silicon-rich silicon oxide. The third dielectric layer 27 may be a tunneling layer. The third dielectric layer 27 may be formed of a silicon oxide or a silicon oxide-based dielectric.

The channel structure 42 may further include the filling insulating layer 36 filling a space within the semiconductor layer 33, and the conductive pad 39 disposed on the filling insulating layer 36. The filling insulating layer 36 may contact the semiconductor layer 33. The filling insulating layer 36 may be formed of an insulating material, for example, a silicon oxide. The conductive pad 39 may be formed of a conductive material, for example, polycrystalline silicon having n-type conductivity.

The semiconductor pattern 38 may be disposed within the channel hole CH. The semiconductor pattern 38 may be disposed below the semiconductor layer 33. The semiconductor pattern 38 may be an epitaxial layer grown from the substrate 3, using a selective epitaxial growth (SEG) process. The semiconductor pattern 38 may contact the semiconductor layer 33. An insulating layer 63 may be disposed between the semiconductor pattern 38 and the lowermost select gate electrode 57g. The insulating layer 63 may contact the semiconductor pattern 38. The insulating layer 63 may be formed of a silicon oxide.

Fourth dielectric layers 54 may be interposed between the conductive layers 57 and the mold insulating layers 8, and may extend between the conductive layers 57 and the dielectric structure 30. The fourth dielectric layer 54 and the first dielectric layer 21 may constitute a blocking layer.

The fourth dielectric layer 54 may be formed of a high-k dielectric material. The high-k dielectric material may be at least one of an aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide (ZrSixOy), a hafnium oxide ($HfO_2$), a hafnium silicon oxide (HfSixOy), a lanthanum oxide ($La_2O_3$), a lanthanum aluminum oxide (LaAlxOy), a lanthanum hafnium oxide (LaHfxOy), a hafnium aluminum oxide (HfAlxOy), and a praseodymium oxide ($Pr_2O_3$). The fourth dielectric layer 54 may be formed of a crystallized aluminum oxide.

A first upper insulating layer 45 may be disposed on the stack structure ST and the channel structure 42. The first upper insulating layer 45 may be formed of an insulating material, such as a silicon oxide.

The common source line 78 may be disposed within an isolation region OP passing through the first upper insulating layer 45 and the stack structure ST and extending into the substrate 3. The isolation region OP may extend in a first direction parallel to the upper surface of the substrate 3. Lateral surfaces of the isolation region OP may be flat, and may not have an uneven pattern, and the width of the isolation region OP may narrow as the isolation region OP approaches the substrate 3. Lateral surfaces of the conductive layers 57 may be coplanar with those of the mold insulating layers 8. The common source line 78 may pass through the first upper insulating layer 45 and the stack structure ST. The common source line 78 may extend in the first direction parallel to the upper surface of the substrate 3, and may cut the first upper insulating layer 45 and the stack structure ST in the second direction perpendicular to the upper surface of the substrate 3.

A recess RCS may be formed in the upper surface of the substrate 3 below the isolation region OP. The common source line 78 may be disposed in the recess RCS. The recess RCS may have side portions including a plurality of stepped portions SP. The width of an upper portion of the recess RCS may be similar to or the same as that of a lower portion of the isolation region OP. Lateral surfaces of the upper portion of the recess RCS may be coplanar with those of the isolation region OP. The width of the upper portion of the recess RCS may be greater than that of the lower portion of the recess RCS. The recess RCS may include a first region R1, a second region R2, and a third region R3 having different widths. The second region R2 may be disposed on the first region R1, and the third region R3 may be disposed on the second region R2. The first width W1 of the first region R1 may be narrower than the second width W2 of the second region R2, and the second width W2 of the second region R2 may be narrower than the third width W3 of the third region R3. The third width W3 of the third region R3 may be similar to or the same as the width of the lower portion of the isolation region OP. Each of lateral surfaces of the third region R3 may be coplanar with a lateral surface of a lowermost mold insulating layer, for example, the first lower mold insulating layer 5L, contacting the upper surface of the substrate 3, of the mold insulating layers 8.

The common source line 78 may be connected to a lowermost portion of the recess RCS. The common source line 78 may contact the lowermost portion of the recess RCS, for example, the first region R1 of the recess RCS. The common source line 78 may include the lowermost portion of the recess RCS, for example, a lower region contacting the first region R1 and an upper region disposed on the lower region, and the width of the upper region may be greater than that of the lower region. The width of the upper region may narrow as the upper region approaches the substrate 3.

In an example, the common source line 78 may be formed of a conductive material. The conductive material may include at least one of a metal, such as Ti, Ta, Cu, Al, or W, and a metal nitride, such as TiN, TaN, or TiAlN.

The insulating spacer 72 may be disposed between the stack structure ST and the common source line 78. The insulating spacer 72 may be disposed between the common source line 78 and the conductive layers 57, and may contact the conductive layers 57 disposed on the isolation region OP. The insulating spacer 72 may extend in the first direction parallel to the upper surface of the substrate 3, for example, in a similar direction or the same direction as that in which the common source line 78 may extend. The insulating spacer 72 may include a silicon oxide, a silicon nitride, a silicon oxynitride, or combinations thereof.

A lower portion of the insulating spacer 72 may contact at least a portion of the stepped portions SP of the recess RCS. The lower portion of the insulating spacer 72 may contact the second region R2 and the third region R3 of the recess RCS. As described above, the common source line 78 may contact the first region R1 of the recess RCS.

The insulating spacer 72 may have a first thickness T1 at a portion on a lateral surface of a lowermost gate electrode, for example, a lateral surface of the lowermost select gate electrode 57g, and may have a second thickness T2 at a portion on a lateral surface of an uppermost gate electrode, for example, a lateral surface of the uppermost select gate electrode 57s, and the second thickness T2 may be similar to or the same as the first thickness T1. A first distance between the lowermost select gate electrode 57g and the common source line 78 may be similar to or the same as a second distance between the uppermost select gate electrode 57s and the common source line 78.

An impurity region 75 may be disposed within the substrate 3 below the common source line 78. The impurity region 75 may be disposed below the recess RCS of the substrate 3. The impurity region 75 may extend in the first direction parallel to the upper surface of the substrate 3, for example, a similar direction or the same direction as that in which the common source line 78 may extend. The impurity region 75 may have different conductivity type from the substrate 3 adjacent to the impurity region 75. For example, the impurity region 75 may have n-type conductivity, and the substrate 3 adjacent to the impurity region 75 may have p-type conductivity. The impurity region 75 may include n-type impurities, and the substrate 3 may include p-type impurities.

The impurity region 75 and the conductive pad 39 may have the same conductivity type. For example, the impurity region 75 and the conductive pad 39 may have n-type conductivity. The conductive pad 39 may be a drain region, and the impurity region 75 may be a source region.

The channel structure 42, passing through the stack structure ST, may be provided as a plurality of channel structures 42. For example, the channel structures 42 may be arranged along the common source line 78 in zigzag form as depicted in FIG. 1.

A second upper insulating layer 81 may be disposed on the first upper insulating layer 45 and the common source line 78. The contact plug 84 may pass through the first and second upper insulating layers 45 and 81, and may electrically connect to the conductive pad 39 of the channel structure 42. The bit line 87 may be disposed on the second upper insulating layer 81 to be electrically connected to the contact plug 84.

Figure 3:
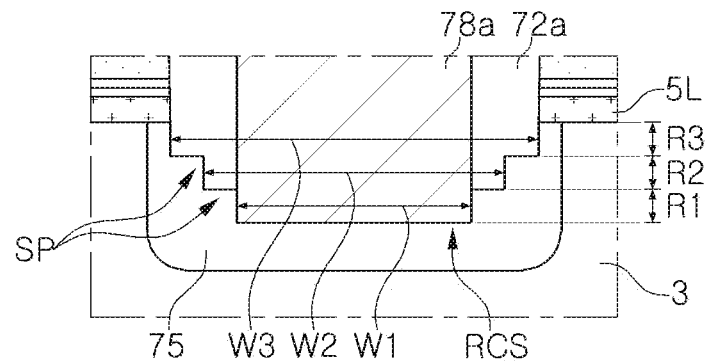
FIG. 3 is a cross-sectional view of a semiconductor device including a common source line having a single region, according to some example embodiments.

FIG. 3 is a cross-sectional view of a semiconductor device including a common source line having a single region, according to some example embodiments. FIG. 3 illustrates only a cross section corresponding to an enlarged region of the recess RCS of FIG. 2.

Referring to FIG. 3, a common source line 78a may be disposed in the recess RCS formed in the upper surface of the substrate 3. The recess RCS may include a first region R1, a second region R2, and a third region R3 having different widths. A first width W1 of the first region R1 may be narrower than a second width W2 of the second region R2, and the second width W2 of the second region R2 may be narrower than a third width W3 of the third region R3.

The common source line 78a may contact the lowermost portion of the recess RCS, for example, the first region R1 of the recess RCS. Unlike the common source line 78 of FIG. 2, the common source line 78a may include a single region. The width of the common source line 78*a* may narrow as the common source line 78*a* approaches the substrate 3.

The thickness of an insulating spacer 72*a* may be greater than that of the insulating spacer 72 of FIG. 2. The thickness of the insulating spacer 72*a* disposed on the first lower mold insulating layer 5L may be the same as the sum of widths of two stepped portions SP in contact with the insulating spacer 72*a*. A lower portion of the insulating spacer 72*a* may contact the second region R2 and the third region R3 of the recess RCS.

Figure 4:
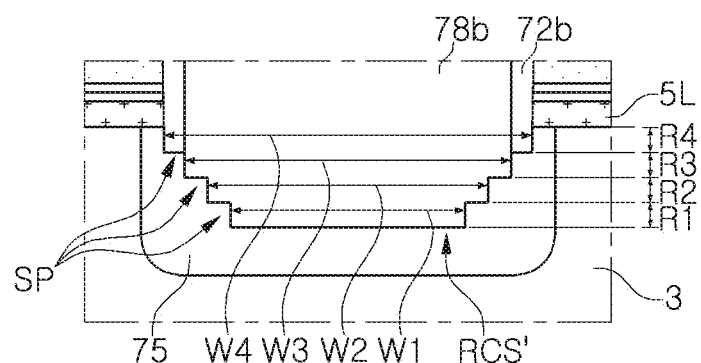
FIG. 4 is a cross-sectional view of a semiconductor device including a recess having four regions of different widths, according to some example embodiments.

FIG. 4 is a cross-sectional view of a semiconductor device including a recess having four regions of different widths, according to some example embodiments. FIG. 4 illustrates only a cross section corresponding to the enlarged region of the recess RCS of FIG. 2.

Referring to FIG. 4, a common source line 78*b* may be disposed in a recess RCS' formed in the upper surface of the substrate 3. The recess RCS' may include a first region R1, a second region R2, a third region R3, and a fourth region R4 having different widths. A first width W1 of the first region R1 may be narrower than a second width W2 of the second region R2, the second width W2 of the second region R2 may be narrower than a third width W3 of the third region R3, and the third width W3 of the third region R3 may be narrower than a fourth width W4 of the fourth region R4. The widths of stepped portions SP may be narrower than those of the stepped portions SP of FIG. 2 or 3.

The common source line 78*b* may contact a lowermost portion of the recess RCS' and a portion of the stepped portions SP. Unlike the common source line 78 of FIG. 2, the common source line 78*b* may include a plurality of regions having different widths, such that the shape of the common source line 78*b* may correspond to that of the recess RCS'. For example, the common source line 78*a* may include three regions having different widths, such that the shape of the common source line 78*a* may correspond to that of the recess RCS'.

The thickness of an insulating spacer 72*b* may be less than that of the insulating spacer 72 of FIG. 2. The thickness of the insulating spacer 72*b* disposed on the first lower mold insulating layer 5L may be similar to or the same as the width of a single stepped portion SP in contact with the insulating spacer 72*b*. A lower portion of the insulating spacer 72*b* may contact the fourth region R4 of the recess RCS'.

FIGS. 5A through 5I are cross-sectional views of a method of fabricating a semiconductor device, according to some example embodiments. The method of fabricating a semiconductor device, illustrated in FIG. 1 or 2, will be described hereinafter with reference to FIGS. 5A through 5I. FIGS. 5A through 5I are the cross-sectional views taken along line I-I' of FIG. 1.

Figure 5A:
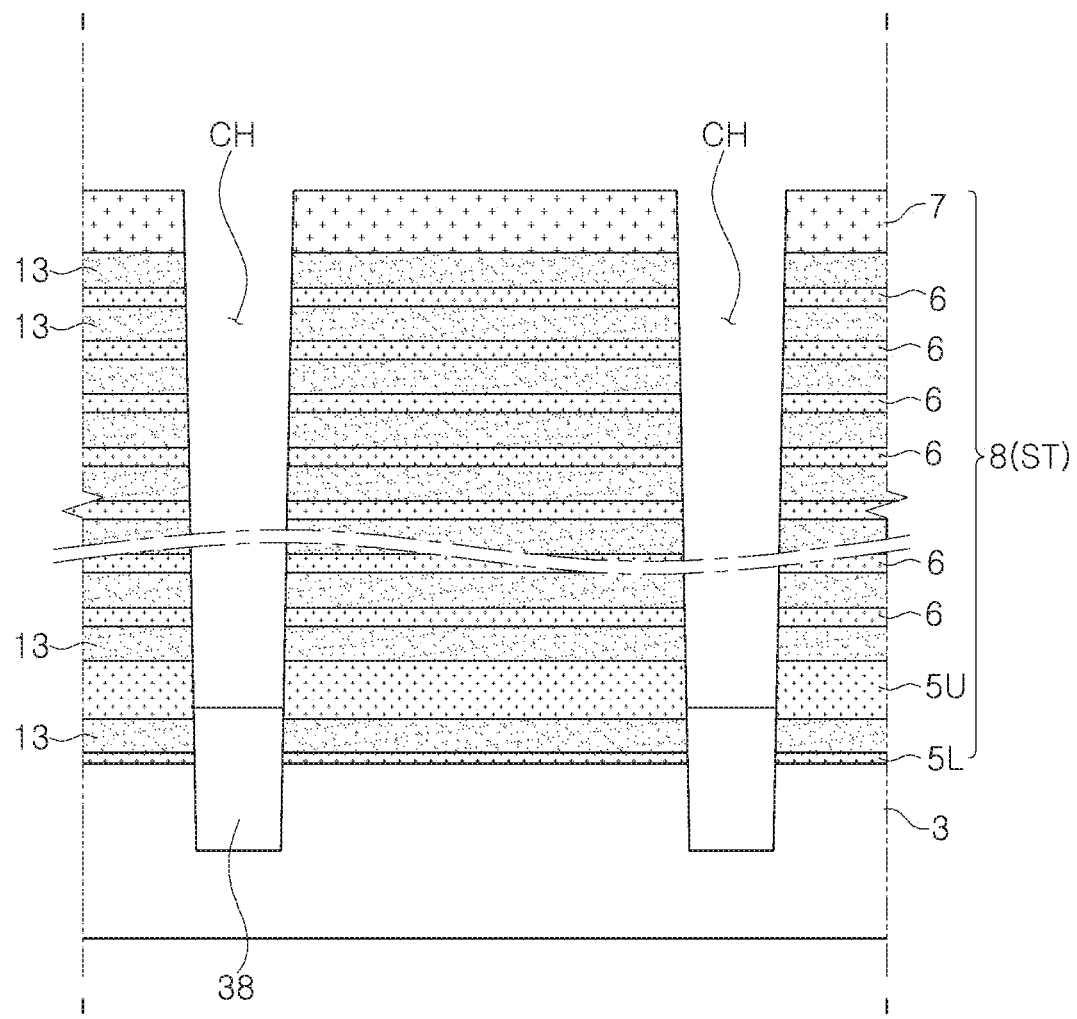
FIGS. 5A through 5I are cross-sectional views of a method of fabricating a semiconductor device, according to some example embodiments.

Referring to FIG. 5A, a substrate 3 may be provided. The substrate 3 may be a semiconductor substrate. A plurality of mold insulating layers 8 and a plurality of sacrificial layers 13 may be formed to be alternately and repeatedly stacked on the substrate 3. The mold insulating layers 8 and the sacrificial layers 13 may constitute a mold structure. The mold insulating layers 8 may be formed of a material having etch selectivity with respect to a material of the sacrificial layers 13. For example, the mold insulating layers 8 may be formed of a silicon oxide, and the sacrificial layers 13 may be formed of a silicon nitride.

The mold insulating layers 8 may include a first lower mold insulating layer 5L, a second lower mold insulating layer 5U disposed on the first lower mold insulating layer 5L, a plurality of intermediate mold insulating layers 6 disposed on the second lower mold insulating layer 5U, and an upper mold insulating layer 7 disposed on the intermediate mold insulating layers 6.

The first lower mold insulating layer 5L may be thinner than each of the intermediate mold insulating layers 6. The second lower mold insulating layer 5U may be thicker than each intermediate mold insulating layer 6. The upper mold insulating layer 7 may be thicker than each intermediate mold insulating layer 6. The sacrificial layers 13 may have a similar thickness or substantially the same thickness.

A channel hole CH may be formed through the mold structure, for example, the mold insulating layers 8 and the sacrificial layers 13. The channel hole CH may be provided as a plurality of channel holes CHs, and may expose the substrate 3. While the channel hole CH is formed, a recess may be formed in an upper portion of the substrate 3. The channel hole CH may include an upper portion having a width greater than that of a lower portion.

A semiconductor pattern 38 may be formed within the recess below the channel hole CH by a SEG process using the substrate 3 as a seed layer. The semiconductor pattern 38 may be a silicon epitaxial layer. An upper surface of the semiconductor pattern 38 may be higher than a lower surface of the second lower mold insulating layer 5U, and may be lower than an upper surface of the second lower mold insulating layer 5U.

Figure 5B:
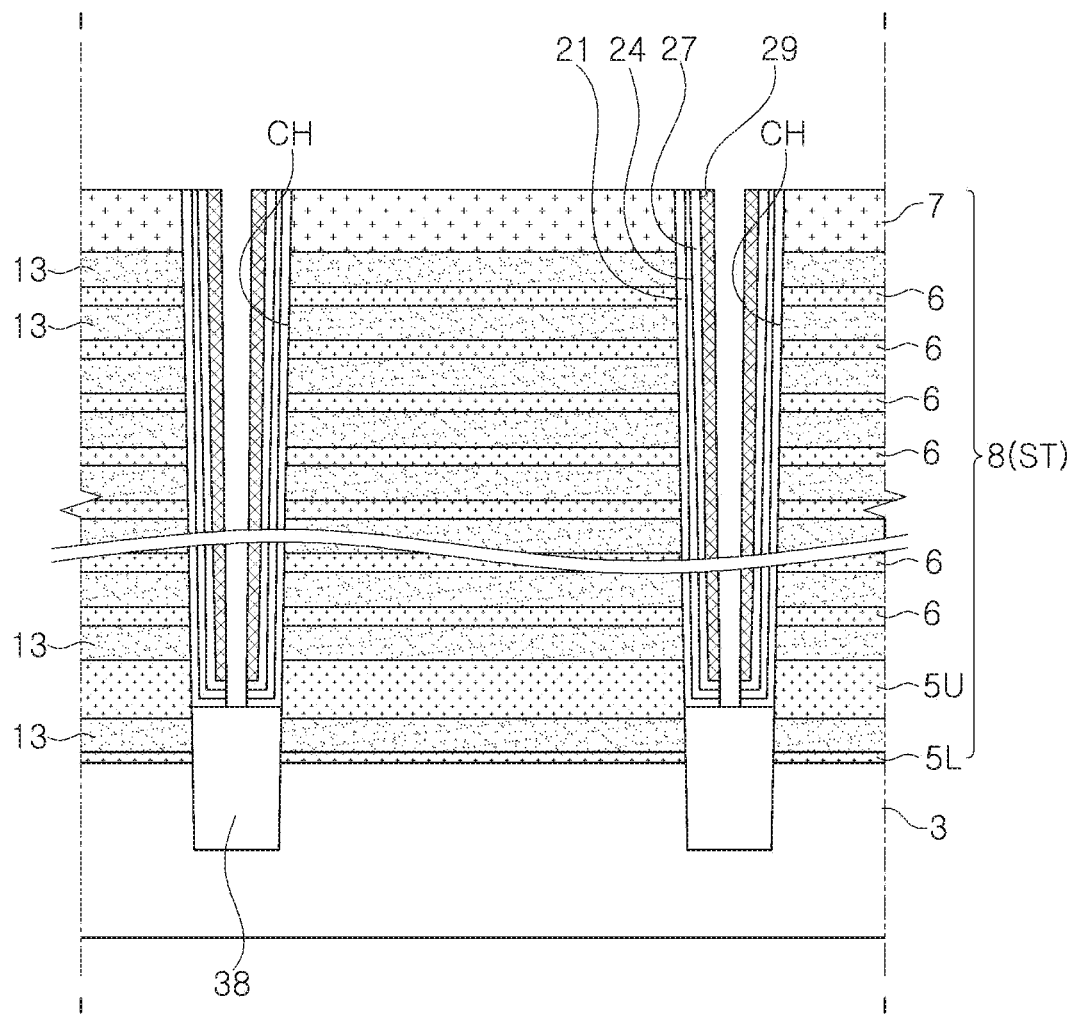

Referring to FIG. 5B, a first dielectric layer 21, a second dielectric layer 24, and a third dielectric layer 27 may be sequentially formed on the substrate 3 having the channel hole CH and the semiconductor pattern 38. A sacrificial spacer 29 may be formed on the third dielectric layer 27 within the channel hole CH, and then the semiconductor pattern 38 may be exposed by anisotropically etching the first to third dielectric layers 21, 24, and 27, using the sacrificial spacer 29 as an etching mask.

Figure 5C:
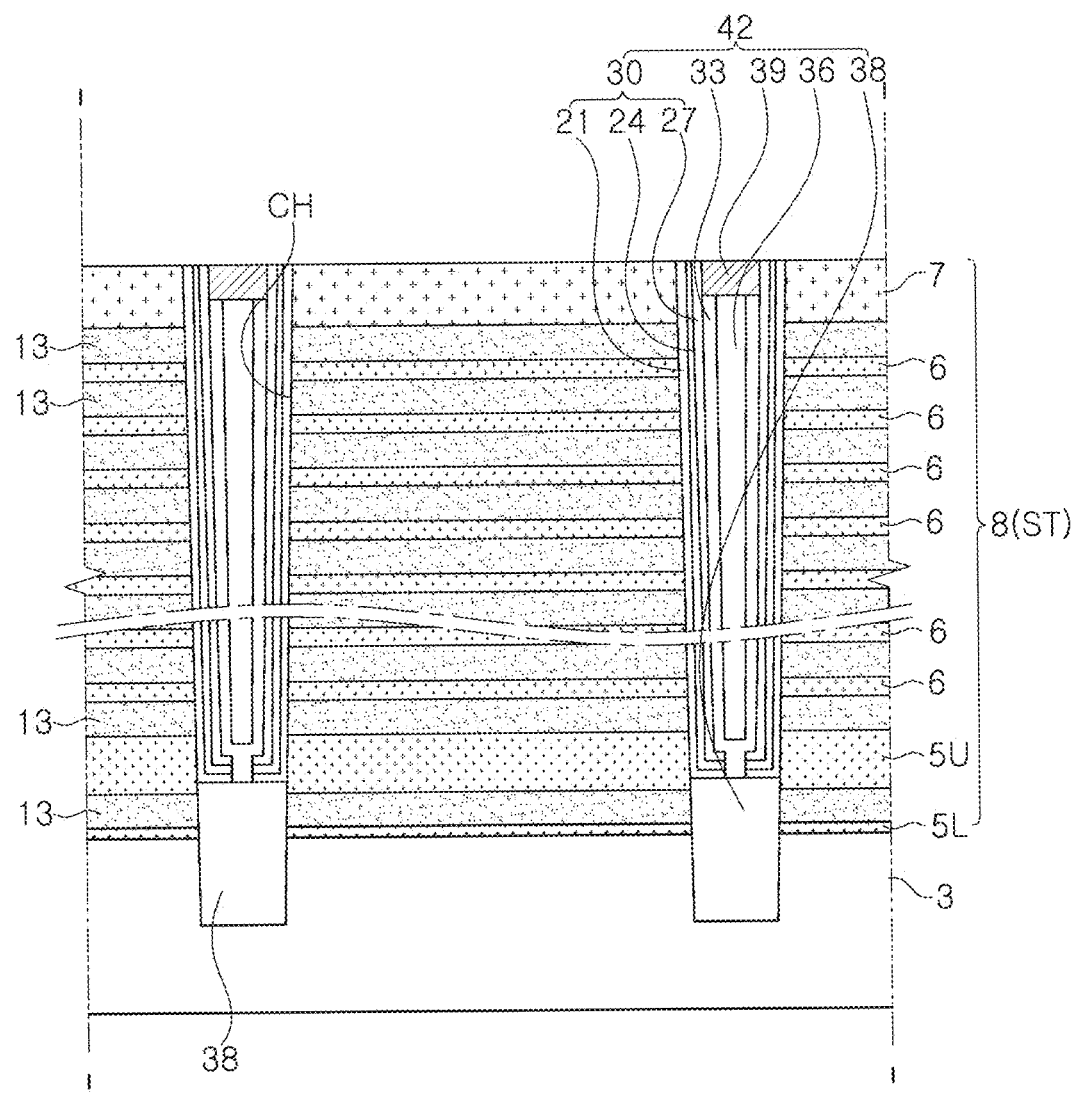

Referring to FIG. 5C, the sacrificial spacer 29 may be removed, and a semiconductor layer 33 may be formed. The semiconductor layer 33 may connect to the semiconductor pattern 38. When the sacrificial spacer 29 is removed, an upper portion of the semiconductor pattern 38 may be partially etched, so as to form a recess region. In this case, the recess region may be filled with the semiconductor layer 33. In some example embodiments, the semiconductor layer 33 may be formed without removing the sacrificial spacer 29.

A filling insulating layer 36 may be formed on the semiconductor layer 33 to fill a portion of the channel hole CH, and a conductive pad 39 may be formed to fill the remainder of the channel hole CH and cover the semiconductor layer 33 and the filling insulating layer 36.

The first to third dielectric layers 21, 24 and 27 may constitute a dielectric structure 30. The semiconductor pattern 38, the conductive pad 39, the semiconductor layer 33, the filling insulating layer 36, and the dielectric structure 30 may constitute a channel structure 42.

Figure 5D:
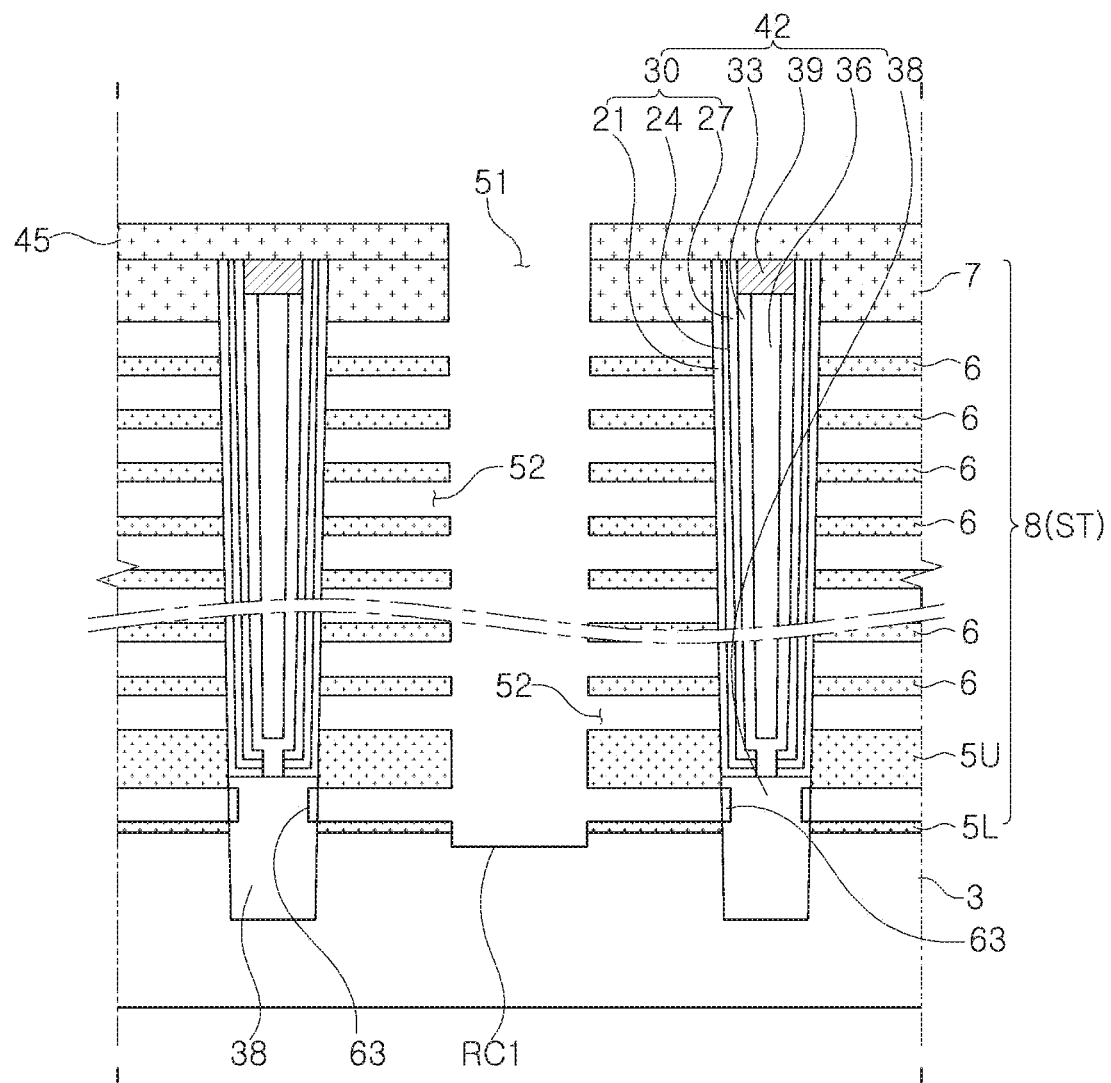

Referring to FIG. 5D, a first upper insulating layer 45 may be formed to cover the channel structure 42 and the upper mold insulating layer 7. A preparatory isolation region 51 may be formed through the first upper insulating layer 45, the mold insulating layers 8, and the sacrificial layers 13 in the second direction perpendicular to the upper surface of the substrate 3. A first preparatory recess RC1 may be formed in the substrate 3, while the preparatory isolation region 51 is formed. Subsequently, lateral opening portions 52 may be formed by selectively removing the sacrificial layers 13 exposed by the preparatory isolation region 51. For example, when the sacrificial layers 13 are silicon nitride layers and the mold insulating layers 8 are silicon oxide layers, an isotropic etching process may be performed using an etchant containing phosphoric acid. The lateral opening portions 52 may extend from the preparatory isolation region 51 to spaces between the mold insulating layers 8 in a horizontal direction, so as to expose portions of a lateral surface of the channel structure 42 and a portion of a lateral surface of the semiconductor pattern 38. By an oxidation process, an insulating layer 63 may be formed on the lateral surface of the semiconductor pattern 38 exposed by the lateral opening portions 52.

Figure 5E:
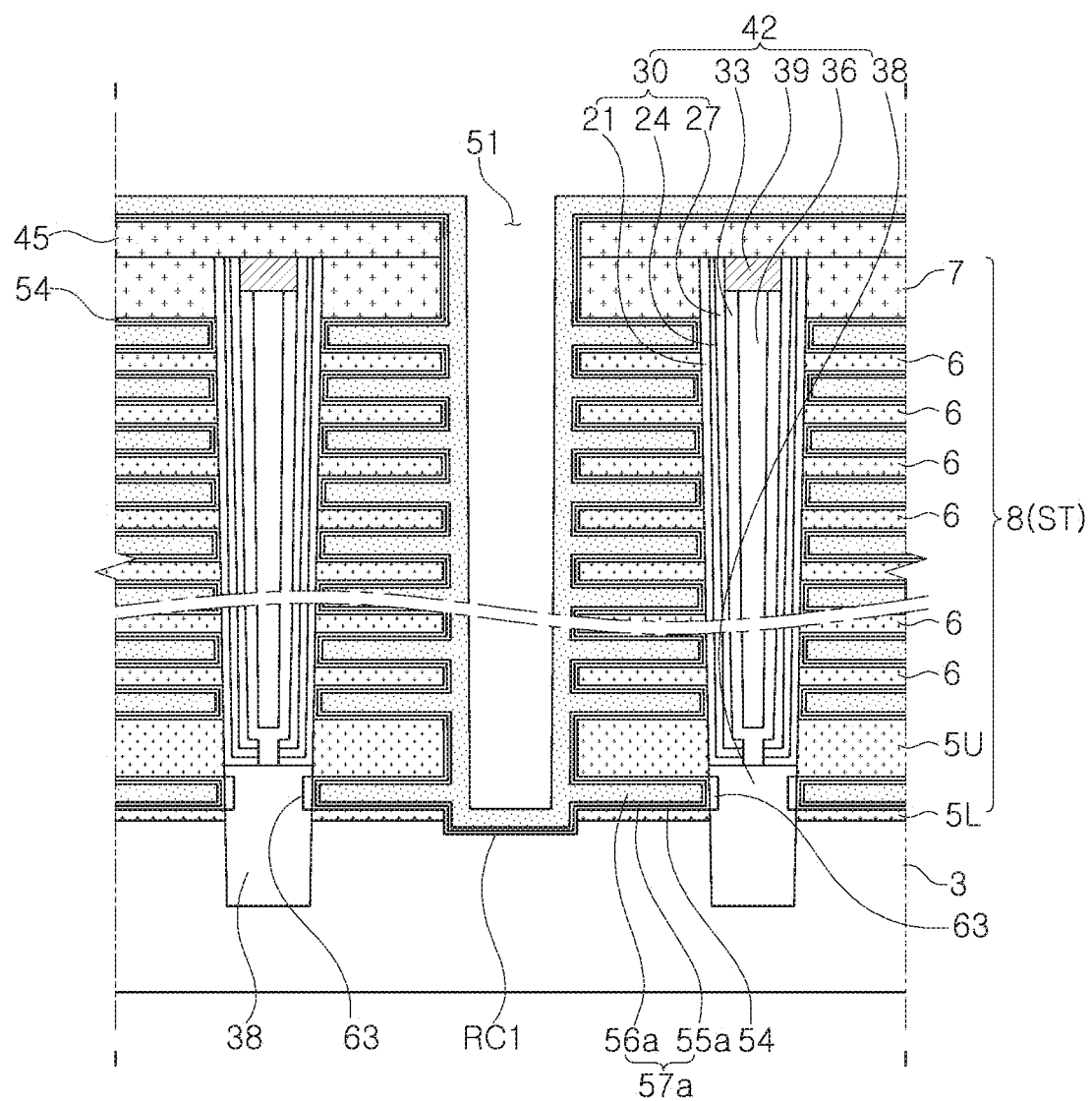

Referring to FIG. 5E, a fourth dielectric layer 54 and a conductive material layer 57a may be formed to fill the lateral opening portions 52.

The fourth dielectric layer 54 may be formed by forming an amorphous metal oxide film and then performing a heat treatment process for crystallization thereon. Selectively, after the heat treatment process, a surface of the metal oxide film may be etched. The heat treatment process may be a spike-rapid thermal processing (RTP) process conducted in an inert gas atmosphere.

Forming the conductive material layer 57a may include forming a first conductive material layer 55a covering the fourth dielectric layer 54, and a second conductive material layer 56a covering the first conductive material layer 55a and filling the lateral opening portions 52, within the lateral opening portions 52.

The fourth dielectric layer 54 and the conductive material layer 57a may also be formed on a lateral surface of the preparatory isolation region 51 and on the first upper insulating layer 45. The fourth dielectric layer 54 and the conductive material layer 57a may also be formed on a surface of the first preparatory recess RC1.

Figure 5F:
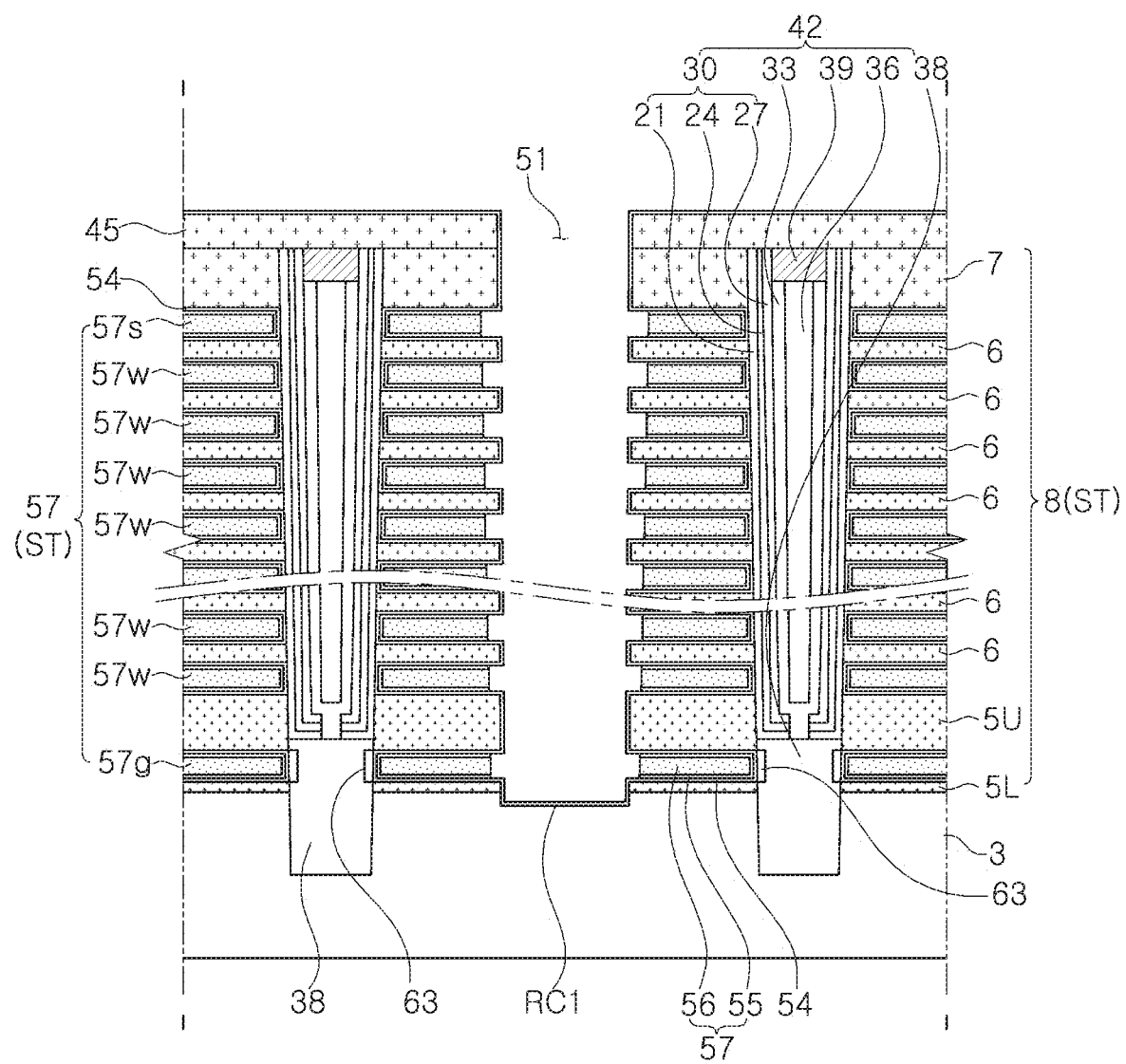

Referring to FIG. 5F, conductive layers 57 may be formed to be separated from each other in the second direction perpendicular to the upper surface of the substrate 3.

By a wet etching process, portions of the conductive material layer 57a formed on the lateral surface of the preparatory isolation region 51, on the first upper insulating layer 45, and on the surface of the first preparatory recess RC1, may be removed.

In this operation, the mold insulating layers 8 may be protruded further than the conductive layers 57. Each of the conductive layers 57 may include a first conductive layer 55 and a second conductive layer 56.

Figure 5G:
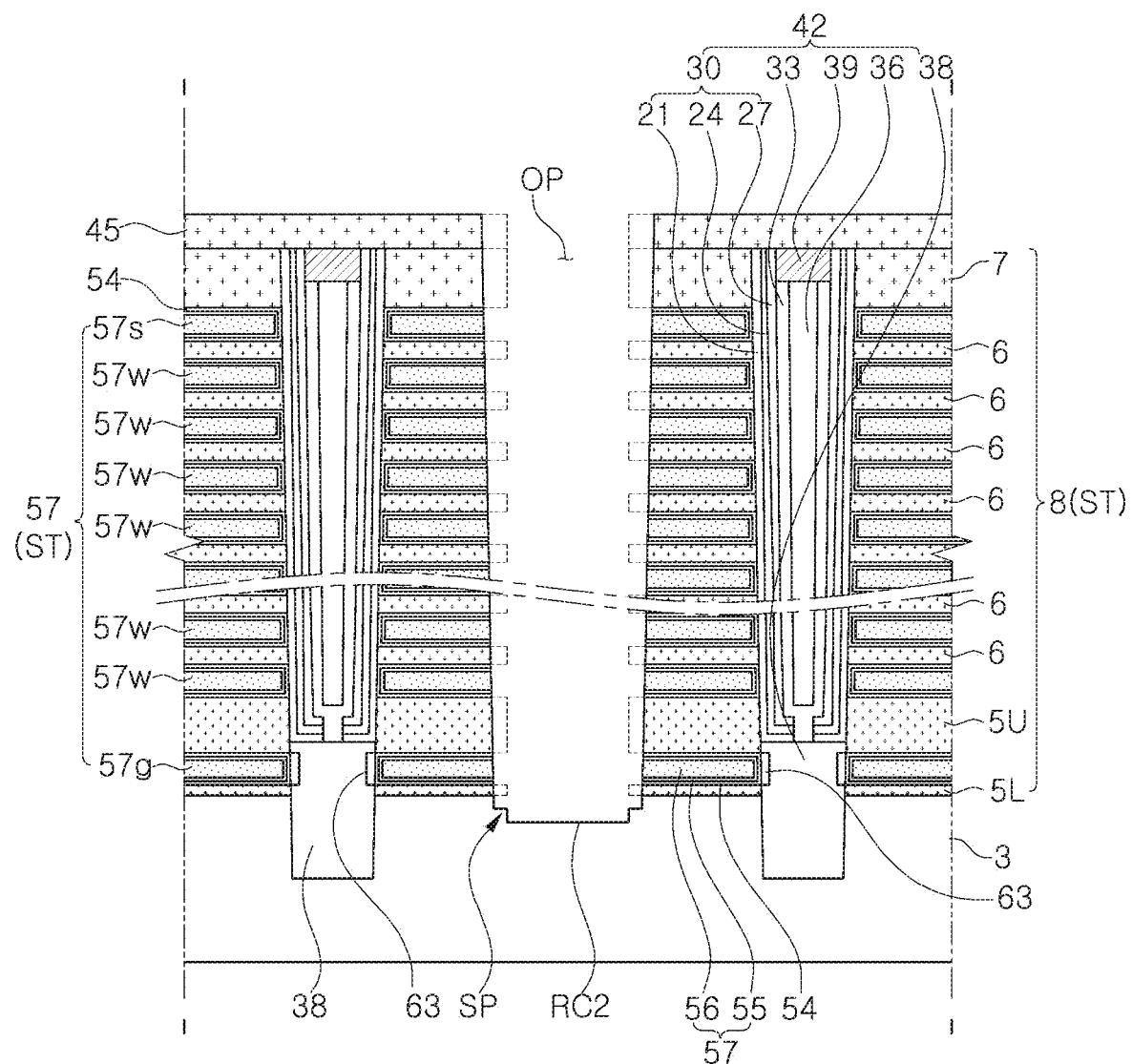

Referring to FIG. 5G, an isolation region OP may be formed by removing protruding portions of the mold insulating layers 8.

By a dry etching process, the protruding portions of the mold insulating layers 8 may be removed. The dry etching process may be performed using an etching gas including a $C_4F_6$ gas, a $C_4F_8$ gas, or combinations thereof. Lateral surfaces of the conductive layers 57 may be coplanar with those of the mold insulating layers 8 within the isolation region OP. Thus, because a slit or void may not be formed within a common source line 78 to be described later in a process of forming the common source line 78, the melting of insulating spacer 72 by a fluorine F2 gas remaining within the slit or void may be reduced or prevented. Further, portions of the first conductive layer 55 that may remain along the protruding portions of the mold insulating layers 8 may removed together, and thus a defect in a bridge between the conductive layers 57 may be reduced or prevented.

In this operation, a second preparatory recess RC2 may be formed in an upper surface of the substrate 3. The second preparatory recess RC2 may be deeper than the first preparatory recess RC1. The second preparatory recess RC2 may have a side portion including a single stepped portion SP. The stepped portion SP may be formed by removing the protruding portions of the mold insulating layers 8 and then etching a portion of the substrate 3 below the protruding portions. The second preparatory recess RC2 may include an upper region and a lower region having different widths. The width of the upper region of the second preparatory recess RC2 may be greater than that of the first preparatory recess RC1. The width of the lower region of the second preparatory recess RC2 may be substantially similar to or the same as that of the first preparatory recess RC1.

Figure 5H:
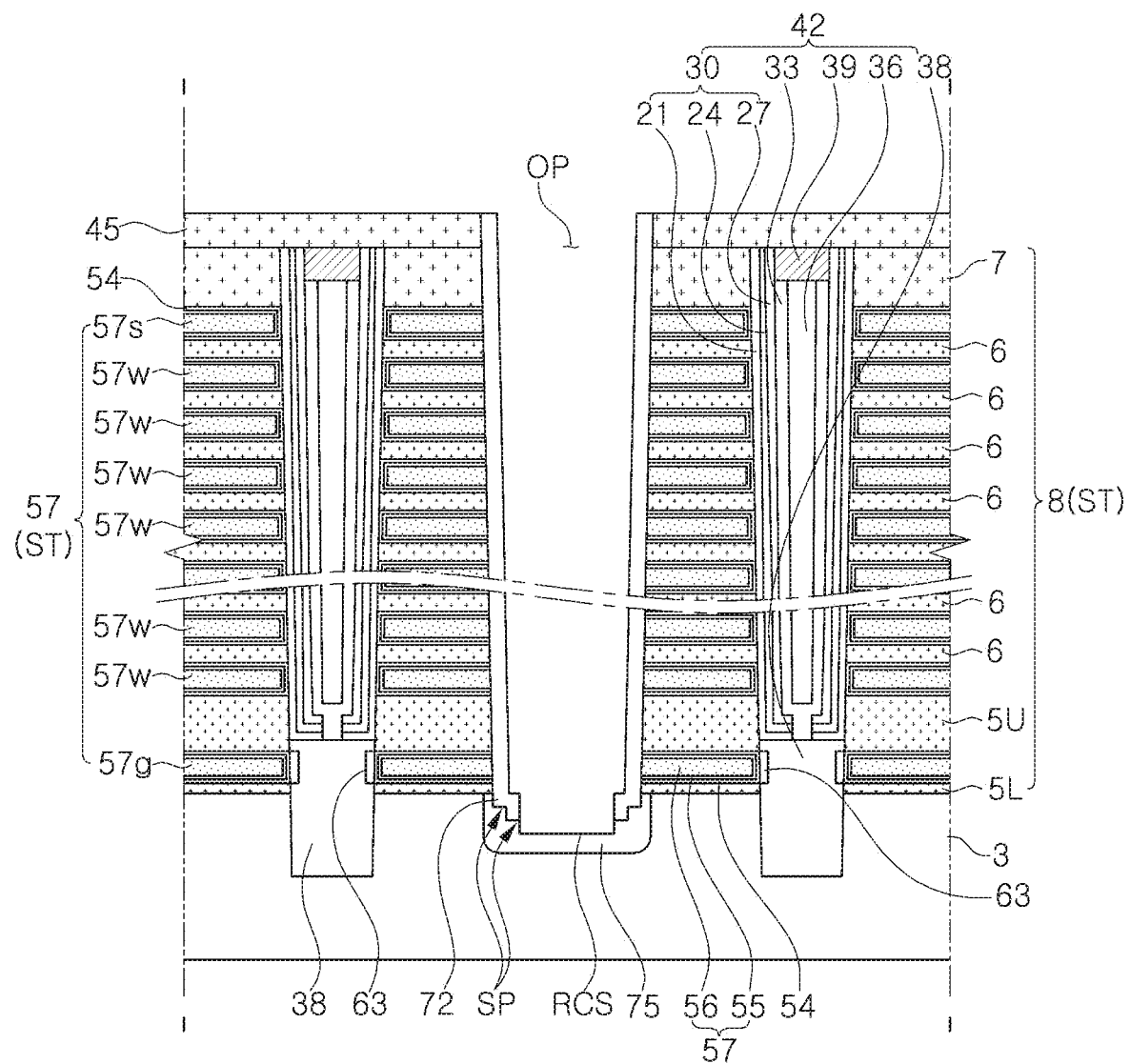

Referring to FIG. 5H, insulating spacers 72 may be formed on lateral surfaces of the isolation region OP.

The insulating spacers 72 may be formed by forming an insulating material layer covering the lateral surfaces of the isolation region OP and an upper surface of the second preparatory recess RC2 and performing an etchback process.

In this operation, a recess RCS may be formed in the substrate 3. The recess RCS may have a side portion having two stepped portions SP. The insulating spacer 72 may be formed on the stepped portions SP of the recess RCS. A lower portion of the insulating spacer 72 may include a bent portion formed along the shape of the recess RCS. A portion of the substrate 3 may be exposed by the isolation region OP.

An impurity region 75 may be formed below the recess RCS. Impurities may be injected by an ion implantation process, subsequent or prior to forming the insulating spacer 72. The impurity region 75 may include, for example, n-type impurities.

Figure 5I:
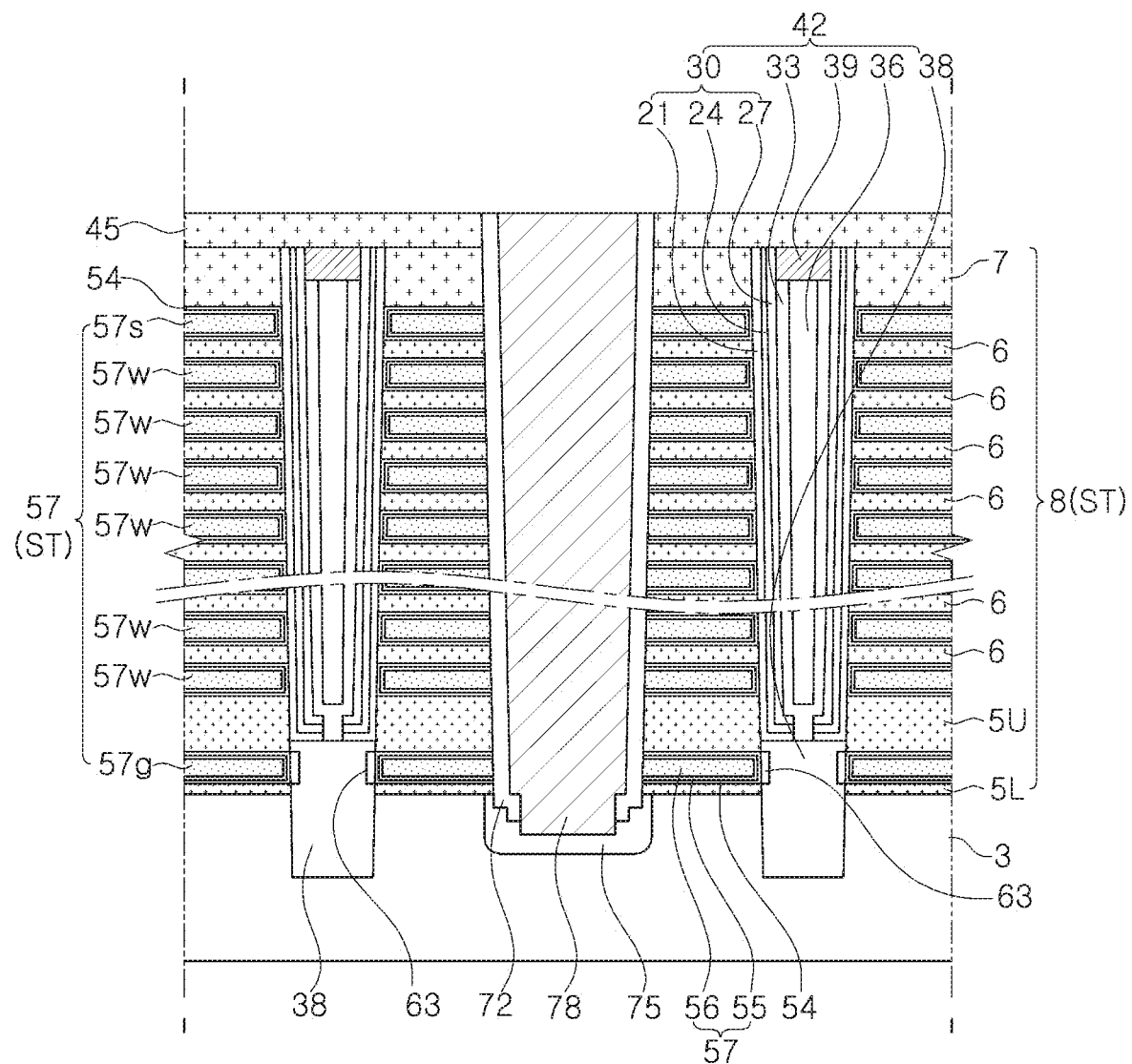

Referring to FIG. 5I, a common source line 78 may be formed to fill between a space between the insulating spacers 72.

The common source line 78 may be formed by depositing a conductive material filling the isolation region OP (FIG. 5H) and performing a planarization process. The common source line 78 may be formed of a conductive material. The conductive material may be formed of at least one of, for example, a metal nitride, a metal silicide, and a metal.

Referring again to FIG. 1 or 2, a second upper insulating layer 81 may be formed on the first upper insulating layer 45 and the common source line 78. A contact plug 84 may be formed to pass through the first and second upper insulating layers 45 and 81 and to be electrically connected to the conductive pad 39 of the channel structure 42. The contact plug 84 may be formed of a metal silicide, a metal nitride, and/or a metal. A bit line 87 may be formed on the second upper insulating layer 81 to be electrically connected to the contact plug 84. The bit line 87 may be formed of a conductive material, for example, a metal nitride, such as TiN or TaN, and a metal, such as W, Al, or Cu.

Unlike the above-mentioned fabrication method, in a fabrication method according to some example embodiments, conductive layers 57 may be formed by a dry etching process, such that the conductive layers 57 may be separated from each other in the second direction perpendicular to the upper surface of the substrate 3.

By the dry etching process, portions of the conductive material layers 57a formed on the lateral surfaces of the preparatory isolation region 51, on the first upper insulating layer 45, and on the surface of the first preparatory recess RC1, may be removed first. Portions of the mold insulating layers 8, exposed by the removal of the portions of the conductive material layer 57a having covered the lateral surfaces of the preparatory isolation region 51, may be removed together with the portions of the conductive material layers 57a by the dry etching process. By the dry etching process, the mold insulating layers 8 and the conductive material layers 57a may be etched at a similar etching rate or the same etching rate.

As described above, lateral opening portions and a second preparatory recess similar to or the same as those of FIG. 5G may be formed by the dry etching process able to etch the mold insulating layers 8 and the conductive material layers 57a together. The dry etching process may be performed using an etching gas including a Cl2 gas.

Figure 6:
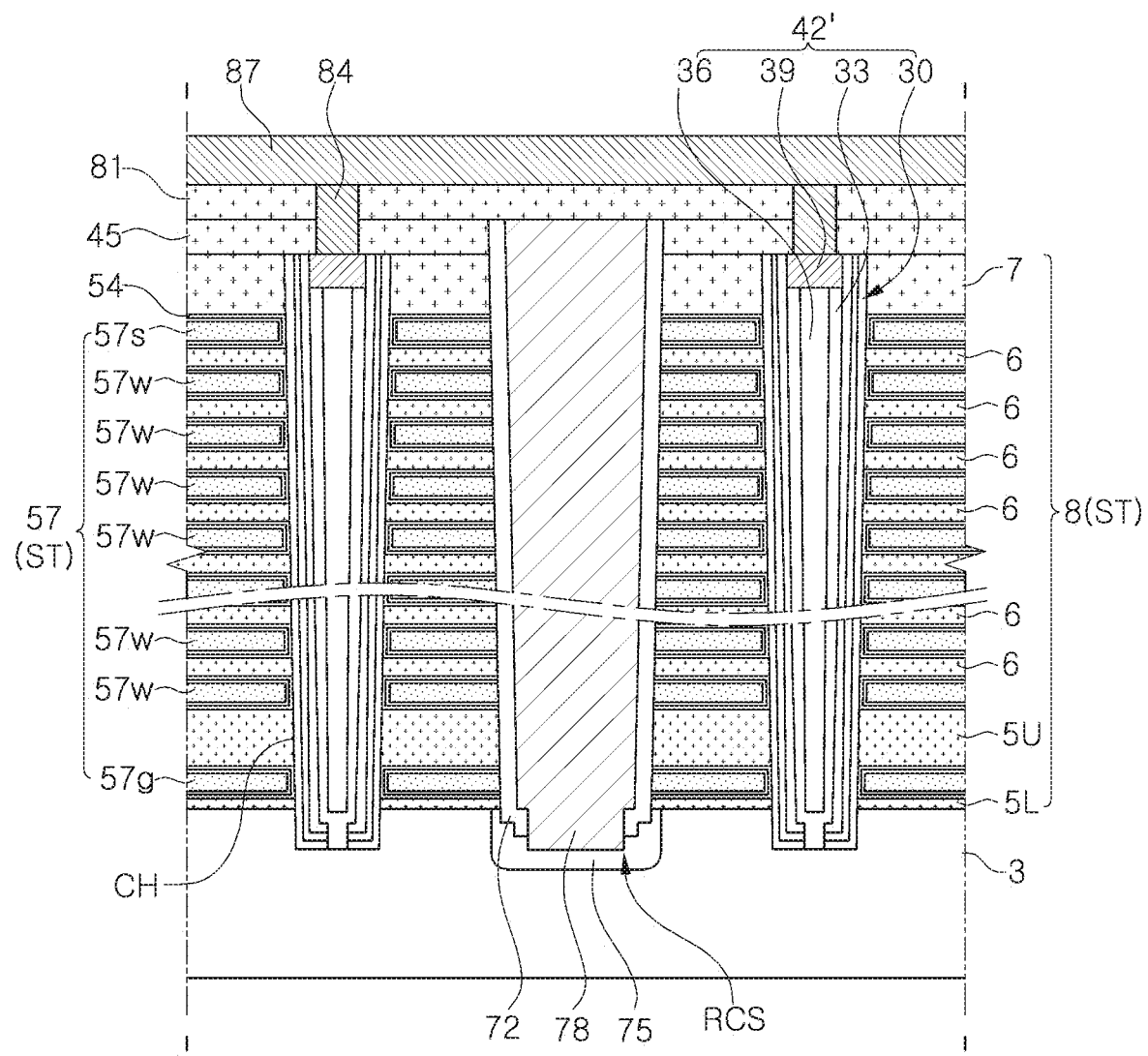
FIG. 6 is a cross-sectional view of a semiconductor device not including the semiconductor pattern of FIG. 2, according to some example embodiments.

FIG. 6 is a cross-sectional view of a semiconductor device not including the semiconductor pattern of FIG. 2, according to some example embodiments.

Unlike the semiconductor device illustrated in FIG. 2, the semiconductor device, illustrated in FIG. 6, may include the channel structure 42' not having the semiconductor pattern 38. Thus, the semiconductor layer 33 may directly contact the substrate 3.

The semiconductor device, illustrated in FIG. 6, may be fabricated by the processes subsequent to those of FIG. 5B without performing the SEG process for forming the semiconductor pattern 38, described above with reference to FIG. 5A.

In the semiconductor device, according to the foregoing, the stack structure ST, the channel structure 42', the common source line 78, the insulating spacer 72, the impurity region 75, and the bit line 87 disposed on the substrate 3 may constitute a memory cell array region. A peripheral circuit region, electrically connecting to such a memory cell array region, may be formed on the substrate 3, and may be disposed externally of the memory cell array region. The peripheral circuit region may include a plurality of transistors. The arrangement of the peripheral circuit region is not limited thereto, and may be modified.

Figure 7:
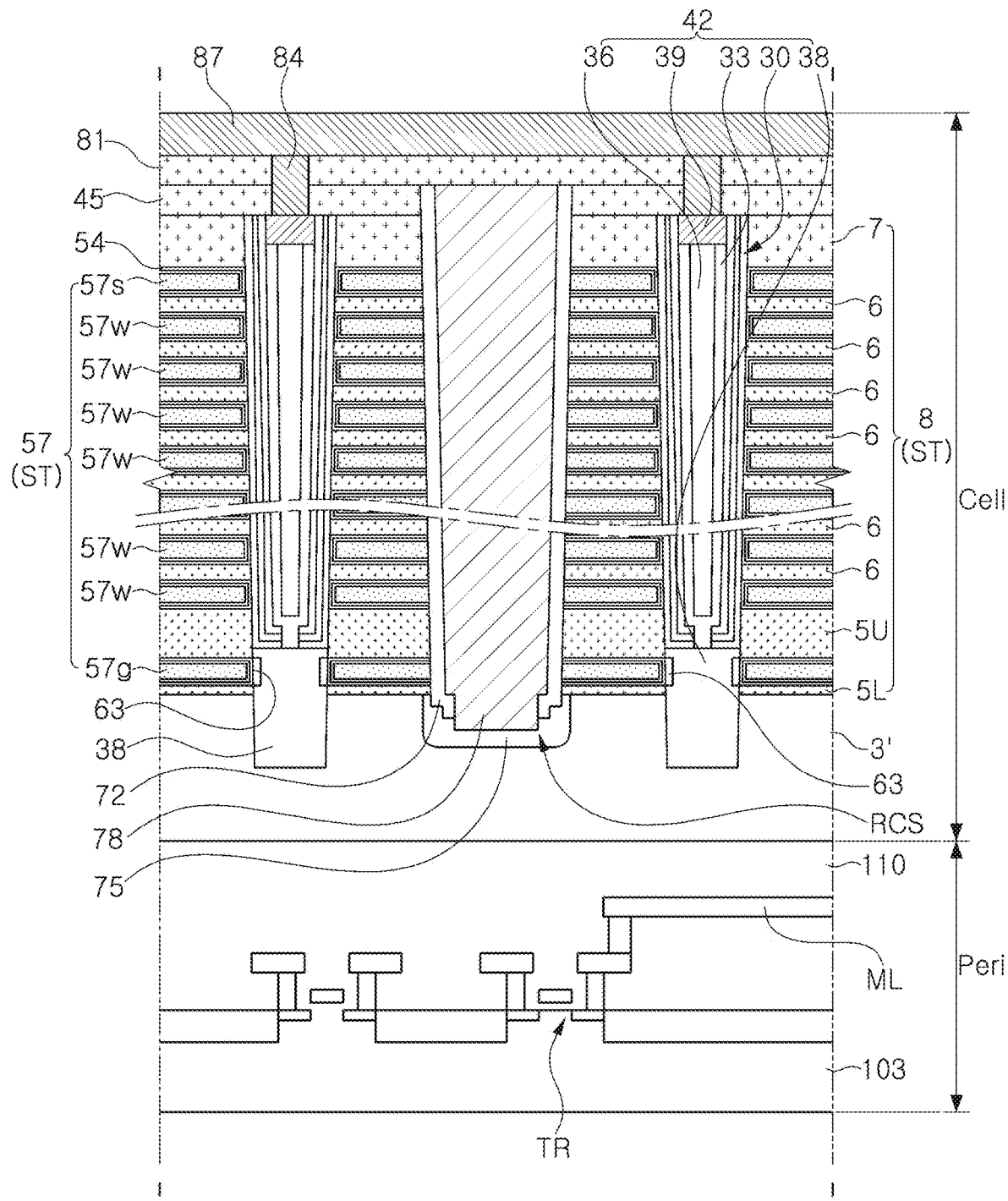
FIG. 7 is a cross-sectional view of a semiconductor device including a memory cell array region and a peripheral circuit region, according to some example embodiments.

FIG. 7 is a cross-sectional view of a semiconductor device including a memory cell array region and a peripheral circuit region, according to some example embodiments.

Referring to FIG. 7, the stack structure ST, the channel structure 42, the common source line 78, the insulating spacer 72, the impurity region 75, and the bit line 87 disposed on a substrate 3' may constitute a memory cell array region Cell. A peripheral circuit region Peri may be disposed below the memory cell array region Cell. The memory cell array region Cell may have the same structure as that illustrated in FIG. 2, but the substrate 3' may include, for example, an amorphous or polycrystalline semiconductor material.

The peripheral circuit region Peri may be formed on a base substrate 103. The base substrate 103 may be a semiconductor substrate. The peripheral circuit region Peri may include a plurality of transistors TR and a plurality of wirings ML. The peripheral circuit region Peri may be covered by a lower insulating layer 110 between the base substrate 103 and the substrate 3'.

Figure 8:
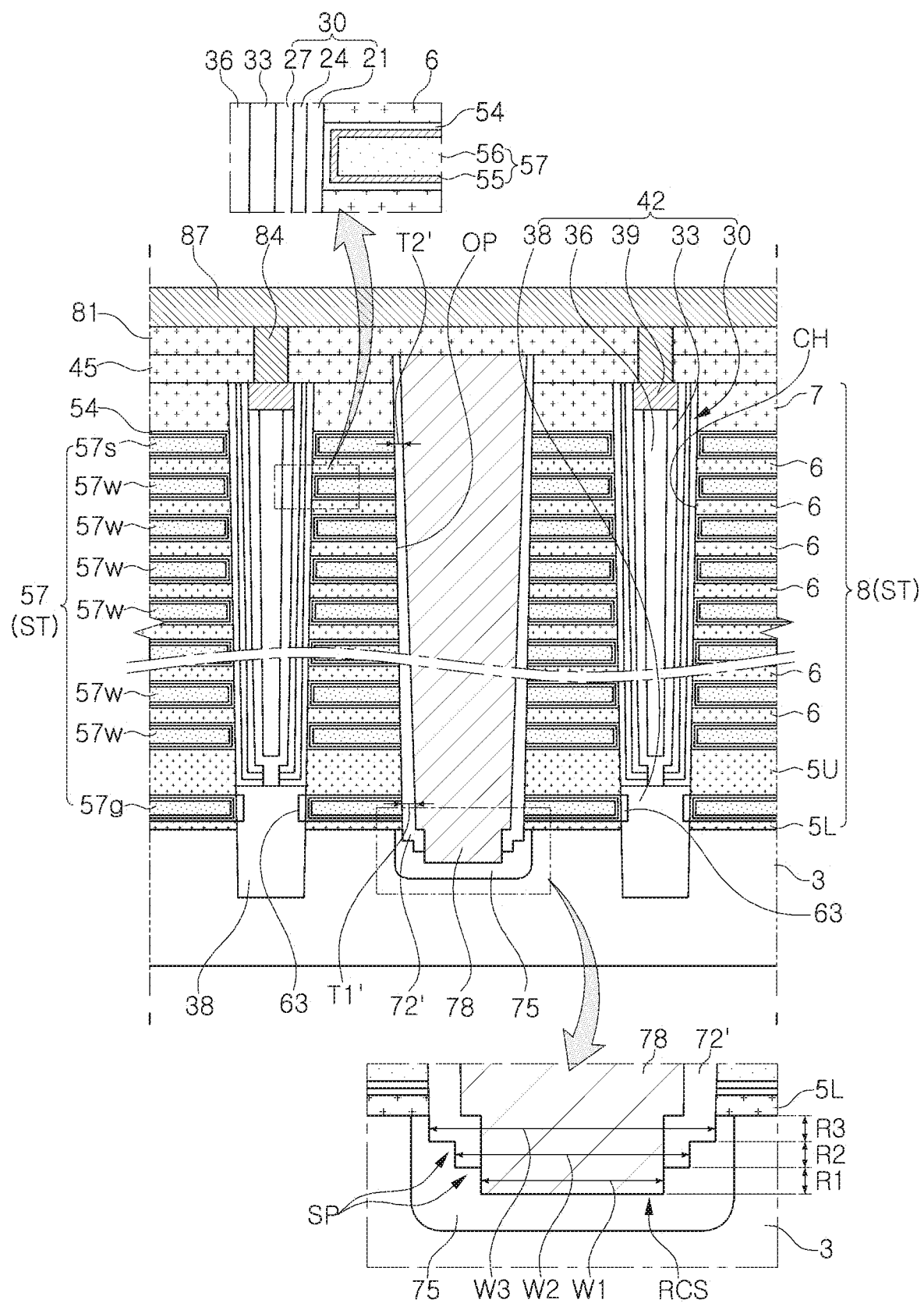
FIG. 8 is a cross-sectional view of a semiconductor device in which the thickness of the insulating spacer varies such that the thickness proximate to the substrate is greater than the thickness remote from the substrate, according to some example embodiments.

FIG. 8 is a cross-sectional view of a semiconductor device in which the thickness of the insulating spacer varies such that the thickness proximate to the substrate is greater than the thickness remote from the substrate, according to some example embodiments.

Referring to FIG. 8, unlike the semiconductor device illustrated in FIG. 2, the insulating spacer 72' may have a first thickness T1' at a portion on a lateral surface of a lowermost gate electrode, for example, a lateral surface of the lowermost select gate electrode 57g, and may have a second thickness T2' at a portion on a lateral surface of an uppermost gate electrode, for example, a lateral surface of the uppermost select gate electrode 57s, and the first thickness T1' may be greater than the second thickness T2'. A first distance between the lowermost select gate electrode 57g and the common source line 78 may be greater than a second distance between the uppermost select gate electrode 57s and the common source line 78.

Figure 9:
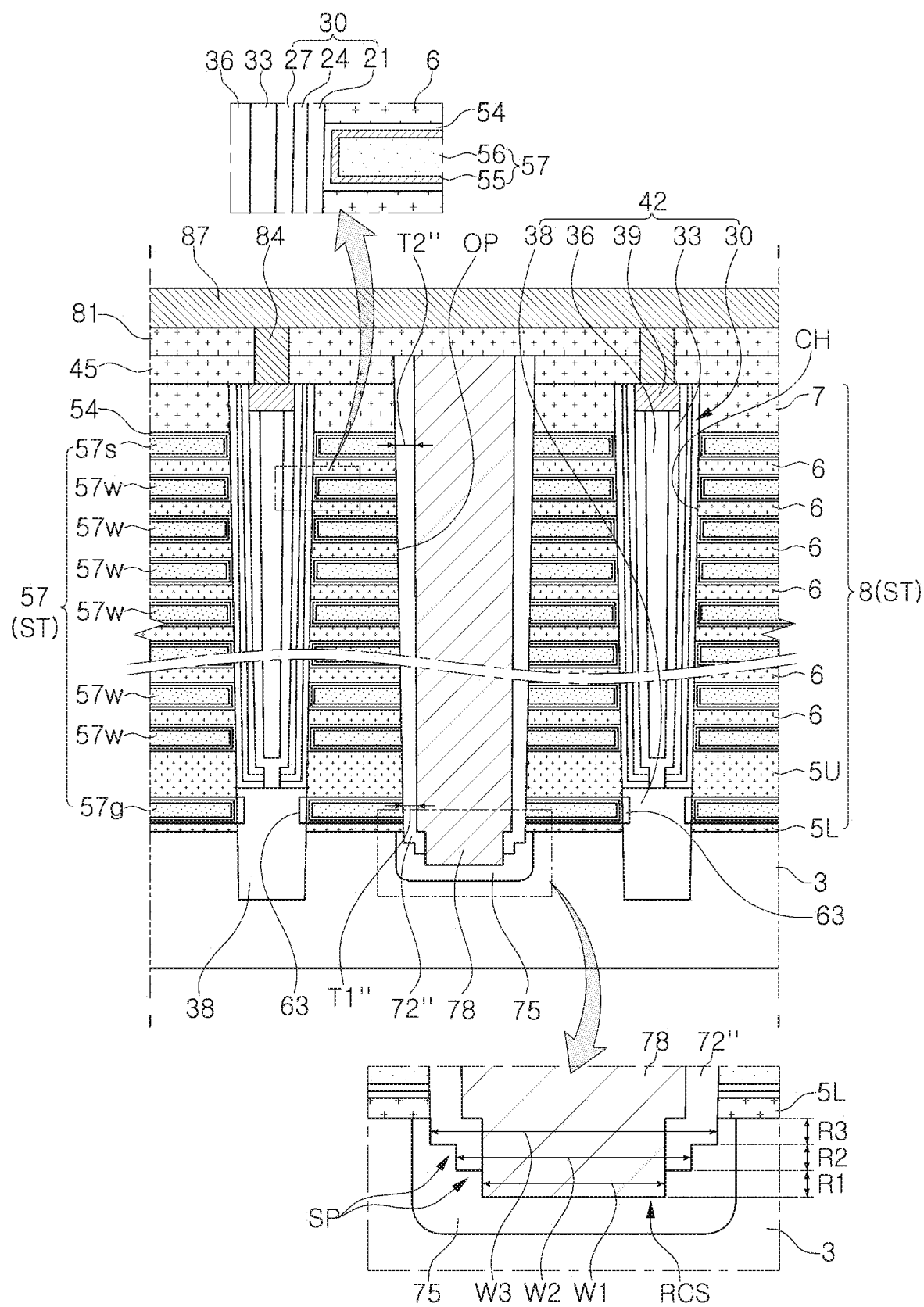
FIG. 9 is a cross-sectional view of a semiconductor device in which the thickness of the insulating spacer varies such that the thickness proximate to the substrate is less than the thickness remote from the substrate, according to some example embodiments.

FIG. 9 is a cross-sectional view of a semiconductor device in which the thickness of the insulating spacer varies such that the thickness proximate to the substrate is less than the thickness remote from the substrate, according to some example embodiments.

Referring to FIG. 9, unlike the semiconductor device illustrated in FIG. 2, the insulating spacer 72" may have a first thickness T1" at a portion on a lateral surface of a lowermost gate electrode, for example, a lateral surface of the lowermost select gate electrode 57g, and may have a second thickness T2" at a portion on a lateral surface of an uppermost gate electrode, for example, a lateral surface of the uppermost select gate electrode 57s, and the first thickness T1" may be less than the second thickness T2". A first distance between the lowermost select gate electrode 57g and the common source line 78 may be less than a second distance between the uppermost select gate electrode 57s and the common source line 78.

As set forth above, according to some example embodiments, there may be provided a semiconductor device in which the occurrence of bridge defects between gate electrodes and between the gate electrodes and a common source line may be reduced, and a slit (or a void) may be reduced or prevented from being formed within the common source line. Further, a semiconductor device having improved reliability may be provided.

While some example embodiments have been shown and described above, it will be apparent to those skilled in the art that modifications and variations could be made without departing from the scope of the appended claims.

What is claimed is:

1. A semiconductor device comprising:
   a substrate including a recess, the substrate defining the recess to include a first region, a second region and a third region having different widths;
   a stack structure including a plurality of gate electrodes and a plurality of mold insulating layers alternately stacked on the substrate;
   a common source pattern passing through the stack structure to contact the substrate at the first region of the recess; and
   an insulating spacer between the stack structure and the common source pattern, the insulating spacer including silicon nitride.

2. The semiconductor device of claim 1, wherein the common source pattern extends in a direction parallel to an upper surface of the substrate, and the insulating spacer including a combination of two or more of silicon compound containing oxygen, silicon compound containing nitrogen.

3. The semiconductor device of claim 1, wherein a first space between a lateral surface of a lowermost gate electrode of the plurality of gate electrodes and the common source pattern is different from a second space between a lateral surface of the substrate at the second region of the recess and the common source pattern, and a lower portion of the insulating spacer includes a bent portion formed according to a shape of the recess, and contacts the substrate at the second region and the third region of the recess.

4. The semiconductor device of claim 1, further comprising:
   a peripheral circuit region below the substrate and on a base substrate, the peripheral circuit region including a plurality of transistors and a plurality of wirings, and the peripheral circuit region overlapping the stack structure in a direction perpendicular to an upper surface of the substrate.

5. The semiconductor device of claim 1, wherein the second region is above the first region, the third region is above the second region, and
a first width of the first region is narrower than a second width of the second region, and the second width of the second region is narrower than a third width of the third region, and
a lateral surface of the third region is coplanar with a lateral surface of a lowermost mold insulating layer of the plurality of mold insulating layers, the lowermost mold insulating layer contacting an upper surface of the substrate.

6. The semiconductor device of claim 1, further comprising:
a first upper insulating layer on the stack structure; and
a second upper insulating layer on the first upper insulating layer and the common source pattern.

7. The semiconductor device of claim 6, further comprising:
a channel structure passing through the stack structure; and
a contact plug passing through the second upper insulating layer, and electrically connecting to the channel structure.

8. A semiconductor device comprising:
a substrate including a recess, the substrate defining the recess to include a first region, a second region and a third region having different widths;
a stack structure including a plurality of gate electrodes and a plurality of mold insulating layers alternately stacked on the substrate;
a common source pattern passing through the stack structure to contact the substrate at the first region of the recess; and
an insulating spacer between the stack structure and the common source pattern, the insulating spacer including silicon compound containing nitrogen.

9. The semiconductor device of claim 8, wherein the common source pattern extends in a direction parallel to an upper surface of the substrate, and the insulating spacer including a combination of two or more of silicon compound containing oxygen, silicon compound containing nitrogen.

10. The semiconductor device of claim 8, wherein the insulating spacer includes a plurality of stepped portions below a lowermost gate electrode of the plurality of gate electrodes.

11. The semiconductor device of claim 8, wherein a first space between a lateral surface of a lowermost gate electrode of the plurality of gate electrodes and the common source pattern is different from a second space between a lateral surface of the substrate at the second region of the recess and the common source pattern, and
a lower portion of the insulating spacer includes a bent portion formed according to a shape of the recess, and contacts the substrate at the second region and the third region of the recess.

12. The semiconductor device of claim 8, further comprising:
a peripheral circuit region below the substrate and on a base substrate, the peripheral circuit region including a plurality of transistors and a plurality of wirings, and the peripheral circuit region overlapping the stack structure in a direction perpendicular to an upper surface of the substrate.

13. The semiconductor device of claim 8, wherein the second region is above the first region, the third region is above the second region, and
a first width of the first region is narrower than a second width of the second region, and the second width of the second region is narrower than a third width of the third region, and
a lateral surface of the third region is coplanar with a lateral surface of a lowermost mold insulating layer of the plurality of mold insulating layers, the lowermost mold insulating layer contacting an upper surface of the substrate.

14. The semiconductor device of claim 8, further comprising:
a first upper insulating layer on the stack structure, and
wherein the common source pattern cuts the first upper insulating layer and the stack structure in a direction parallel to an upper surface of the substrate, and vertically penetrates the first upper insulating layer.

15. The semiconductor device of claim 8, further comprising;
a first upper insulating layer on the stack structure; and
a second upper insulating layer on the first upper insulating layer and the common source pattern.

16. The semiconductor device of claim 15, further comprising;
a channel structure passing through the stack structure; and
a contact plug passing through the second upper insulating layer, and electrically connecting to the channel structure.

17. A semiconductor device comprising:
a substrate including a recess, the substrate defining the recess to include a first region, a second region and a third region having different widths;
a stack structure including a plurality of gate electrodes and a plurality of mold insulating layers alternately stacked on the substrate;
a peripheral circuit region below the substrate and on a base substrate, the peripheral circuit region including a plurality of transistors and a plurality of wirings, the peripheral circuit region overlapping the stack structure in a direction perpendicular to an upper surface of the substrate;
a common source pattern passing through the stack structure to contact the substrate at the first region of the recess, the common source pattern extending in a direction parallel to an upper surface of the substrate; and
an insulating spacer between the stack structure and the common source pattern, the insulating spacer including silicon compound containing nitrogen.

18. The semiconductor device of claim 17, wherein the insulating spacer including a combination of two or more of silicon compound containing oxygen, silicon compound containing nitrogen.

19. The semiconductor device of claim 17, wherein the insulating spacer includes a plurality of stepped portions below a lowermost gate electrode of the plurality of gate electrodes.

20. The semiconductor device of claim 17, wherein a first space between a lateral surface of a lowermost gate electrode of the plurality of gate electrodes and the common source pattern is different from a second space between a lateral surface of the substrate at the second region of the recess and the common source pattern, and a lower portion of the insulating spacer includes a bent portion formed according to a shape of the recess, and contacts the substrate at the second region and the third region of the recess.

21. The semiconductor device of claim 17, wherein the second region is above the first region, the third region is above the second region, and a first width of the first region is narrower than a second width of the second region, and the second width of the second region is narrower than a third width of the third region, and a lateral surface of the third region is coplanar with a lateral surface of a lowermost mold insulating layer of the plurality of mold insulating layers, the lowermost mold insulating layer contacting an upper surface of the substrate.

22. The semiconductor device of claim 17, further comprising;

a first upper insulating layer on the stack structure; and
a second upper insulating layer on the first upper insulating layer and the common source pattern.

23. The semiconductor device of claim 22, further comprising;

a channel structure passing through the stack structure; and
a contact plug passing through the second upper insulating layer, and electrically connecting to the channel structure.

24. A semiconductor device comprising:

a substrate including a recess, the substrate defining the recess to include a first region, a second region and a third region having different widths;

a stack structure including a plurality of gate electrodes and a plurality of mold insulating layers alternately stacked on the substrate;

a peripheral circuit region below the substrate and on a base substrate, the peripheral circuit region including a plurality of transistors and a plurality of wirings, the peripheral circuit region overlapping the stack structure in a direction perpendicular to an upper surface of the substrate;

a common source pattern passing through the stack structure to contact the substrate at the first region of the recess;

an insulating spacer between the stack structure and the common source pattern, the insulating spacer including silicon compound containing nitrogen;

an upper insulating layer on the stack structure;
a channel structure passing through the stack structure; and
a contact plug passing through the upper insulating layer, and electrically connecting to the channel structure.

25. The semiconductor device of claim 24, wherein the insulating spacer including a combination of two or more of silicon compound containing oxygen, silicon compound containing nitrogen.

26. The semiconductor device of claim 24, wherein the substrate defining a side portion of the recess to include a plurality of stepped portions.

27. The semiconductor device of claim 24, wherein the common source pattern extends in a direction parallel to an upper surface of the substrate.

28. The semiconductor device of claim 24, wherein the common source pattern cuts the upper insulating layer and the stack structure in a direction parallel to an upper surface of the substrate, and vertically penetrates the upper insulating layer.

29. The semiconductor device of claim 24, wherein a first space between a lateral surface of a lowermost gate electrode of the plurality of gate electrodes and the common source pattern is different from a second space between a lateral surface of the substrate at the second region of the recess and the common source pattern, and a lower portion of the insulating spacer includes a bent portion formed according to a shape of the recess, and contacts the substrate at the second region and the third region of the recess.

30. The semiconductor device of claim 24, wherein the second region is above the first region, the third region is above the second region, and a first width of the first region is narrower than a second width of the second region, and the second width of the second region is narrower than a third width of the third region, and a lateral surface of the third region is coplanar with a lateral surface of a lowermost mold insulating layer of the plurality of mold insulating layers, the lowermost mold insulating layer contacting an upper surface of the substrate.

* * * * *